United States Patent [19]

Kubota

[11] Patent Number: 4,868,137
[45] Date of Patent: Sep. 19, 1989

[54] METHOD OF MAKING INSULATED-GATE FIELD EFFECT TRANSISTOR

[75] Inventor: Taishi Kubota, Tokyo, Japan

[73] Assignee: NEC Corporation, Tokyo, Japan

[21] Appl. No.: 291,571

[22] Filed: Dec. 29, 1988

[30] Foreign Application Priority Data

Dec. 29, 1987 [JP] Japan .................................. 62-333364

[51] Int. Cl.[4] ..................... H01L 21/00; H01L 21/02; H01L 21/285; H01L 21/425
[52] U.S. Cl. ......................................... 437/41; 437/29; 437/43; 437/984; 148/DIG. 53
[58] Field of Search ..................... 437/29, 41, 43, 984; 148/DIG. 53

[56] References Cited

U.S. PATENT DOCUMENTS

| | | | |
|---|---|---|---|
| 3,996,657 | 12/1976 | Simko et al. | 437/44 |
| 4,343,657 | 8/1982 | Ito et al. | 437/41 |
| 4,356,623 | 11/1982 | Hunter | 437/41 |
| 4,453,306 | 6/1984 | Lynch et al. | 437/984 |
| 4,488,162 | 12/1984 | Jambotkar | 437/41 |
| 4,488,351 | 12/1984 | Momose | 437/41 |
| 4,512,073 | 4/1985 | Hsu | 437/41 |
| 4,636,822 | 1/1987 | Codella et al. | 437/41 |
| 4,637,124 | 1/1987 | Okuyama et al. | 437/41 |
| 4,653,173 | 3/1987 | Chen | 437/41 |
| 4,663,827 | 5/1987 | Nakahara | 437/41 |
| 4,795,718 | 1/1989 | Beitman | 437/41 |

FOREIGN PATENT DOCUMENTS

| | | | |
|---|---|---|---|
| 0216053 | 4/1987 | European Pat. Off. | 437/41 |
| 0140818 | 3/1980 | Fed. Rep. of Germany | 437/41 |
| 0012565 | 1/1979 | Japan | 437/43 |
| 0063874 | 5/1980 | Japan | 437/29 |
| 0111161 | 8/1980 | Japan | 437/43 |
| 0162874 | 12/1981 | Japan | 437/41 |
| 0054345 | 3/1982 | Japan | 437/984 |
| 0198663 | 12/1982 | Japan | 437/41 |
| 0004015 | 1/1984 | Japan | 437/29 |
| 60-004264 | 1/1985 | Japan . | |
| 0040701 | 9/1985 | Japan | 437/41 |
| 2100507 | 12/1982 | United Kingdom | 437/984 |

OTHER PUBLICATIONS

El-Kareh, B., Method for Forming Laterally Graded FET Junctions, IBM Technical Disclosure Bulletin, vol. 27, No. 6, Nov. 1984, pp. 3439-3441.

Tanigaki, Y., A New Self-Aligned Contact Technology, J. Electrochem. Soc.: Solid-State Science and Technology, vol. 125, No. 3, Mar. 1977, pp. 471-472.

"High Performance Half-Micron PMOSFETs with 0.1 UM Shallow P+$N$ Junction Utilizing Selective Silicon Growth and Rapid Thermal Annealing" by Hideki Shibata et al., 1987 IEEE CH2515-5/87/0000-0590, pp. IEDM 87 590-593.

"A Super Self-Aligned Source/Drain MOSFET" by C. K. Lau et al., 1987 IEEE CH2515-5/87/0000-0358, pp. IEDM 87 358-361.

Primary Examiner—Brian E. Hearn
Assistant Examiner—B. Everhart
Attorney, Agent, or Firm—Laff, Whitesel, Conte & Saret

[57] ABSTRACT

A method of manufacturing an insulated-gate field effect transistor is comprised of forming on a semiconductor substrate a gate electrode elecrically insulated from the substrate. A flat insulating film of silicon oxide is formed over the substrate. A pair of openings are formed through the flat insulating film at both sides of the gate electrode such that opposite side thereof are etched and exposed. An oxide film is formed on the exposed side edges of the gate electrode. Impurities are implanted through the pair of openings into the substrate to form source and drain regions. An electroconductive polysilicon film is deposited over the substrate. The deposited polysilicon film is polished to leave a part thereof selectively in the openings to thereby form electrical contacts to the source and drain regions through the openings.

7 Claims, 8 Drawing Sheets

METHOD OF MAKING INSULATED-GATE FIELD EFFECT TRANSISTOR

BACKGROUND OF THE INVENTION

1. Field of the Invention

The present invention relates to a method of making an insulated-gate field effect transistor, and more specifically relates to improvements in forming electrical contacts to source and drain regions of the transistor.

2. Description of the Related Art

In the very, large scale integrated circuit device, electrical contacts to the source and drain regions of the insulated-gate field effect transistor have been formed according to the following conventional manufacturing process as shown in FIGS. 1A-1F.

First, an oxide film 202 for element isolation is formed on a silicon substrate 201 for isolating individual element areas from each other on the substrate 201, and thereafter a gate-insulating oxide film 210 is formed on the area surrounded by the isolating oxide film 202. Then, polysilicon gates 203, 203' are formed by means of the photolithography technology (FIG. 1A). Thereafter, oxide films 204, 204' are formed to cover the respective polysilicon gates 203, 203' including the sides thereof (FIG. 1B). Then, diffusion regions 205 and 205' are formed to constitute source and drain regions (FIG. 1C). An insulating inter-layer 206 is deposited on the substrate 201 (FIG. 1D), and thereafter contact holes are opened by means of the photolithography technology (FIG. 1E). Lastly, aluminum wirings 207, 207' and 207" are provided through the contact holes to form electrical contacts to the source and drain regions 205 and 205' (FIG. 1F).

In the above-mentioned conventional method of manufacturing the insulated-gate field effect transistor, the distances between these contact holes and the polysilicon gate is restricted to a certain limit due to an alignment margin of the photolithography technology and process margin in etching the insulating inter-layer to open the contact holes. For this reason, the miniaturization of insulated-gate field effect transistor cannot be effectively achieved. In addition, during the process of providing the aluminum wirings, the aluminum wirings must clear steeply etched step portions of the contact hole, hence there is a drawback that the miniaturization of the insulted-gate field effect transistor would cause breaking of the aluminum wirings.

SUMMARY OF THE INVENTION

It is, therefore, an object of the present invention to reduce the distances between the contact holes for source and drain and the polysilicon gates without regard to the mask alignment margin and the processing margin, and to eliminate the steep step portion of the contact holes to thereby achieve the miniaturization of the insulated-gate field effect transistors in the large scale integrated circuit device.

The method of manufacturing the insulated-gate field effect transistor in accordance with the present invention includes a step of forming a gate electrode on a semiconductor substrate and thereafter forming a flat insulating film over the entire surface of the semiconductor substrate, a step of selectively etching the flat insulating film to form therein the openings at both sides of the gate electrode such that a part of each opening exposes the side of the gate electrode and the bottom part thereof exposes the surface of semiconductor substrate and thereafter forming an oxide film on the exposed sides of the gate electrode, a step of doping impurities to form source and drain regions in the substrate through the openings, a step of depositing an electroconductive film over the entire surface of the substrate, and a step of selectively polishing the electroconductive film to separate part of the electroconductive film filled in the opening.

Another feature of the present invention includes a step of forming on a silicon substrate of a first conductivity type a polysilicon gate electrode doped with a high concentration of impurities and thereafter forming a flat insulating film over the entire surface of the silicon substrate, a step of forming the openings at both sides of the gate electrode through the flat insulating film such that a part of the each opening reaches the gate electrode to expose the sides thereof and the bottom part of the each opening exposes the silicon substrate and thereafter forming a silicon oxide films on the exposed sides of the gate electrode by means of the thermal oxidization, a step of doping impurities of a second conductivity type into the substrate through the openings to form source and drain regions, a step of removing thin silicon oxide films over the source and drain regions, which is formed during the thermal oxidation of the gate electrode, and depositing a polysilicon over the entire surface of substrate, and a step of selectively polishing the deposited polysilicon to separate part thereof filled in the openings.

According to the present manufacturing method, the distances between the openings or contact holes and the gate electrode is determined by the thickness of the oxide film formed on the sides of gate electrode without regard to the alignment margin and processing margin. Furthermore, a step portion of the contact hole forms a flat surface with the flat insulating film to facilitate establishing reliable contacts with wirings to be formed on the flat surface.

DESCRIPTION OF THE PREFERRED EMBODIMENT

A preferred embodiment of manufacturing the insulated-gate field effect transistor according to the present invention will be explained with reference to FIGS. 2A to 2J, 3A, 3C and 3F.

Figure 1A:
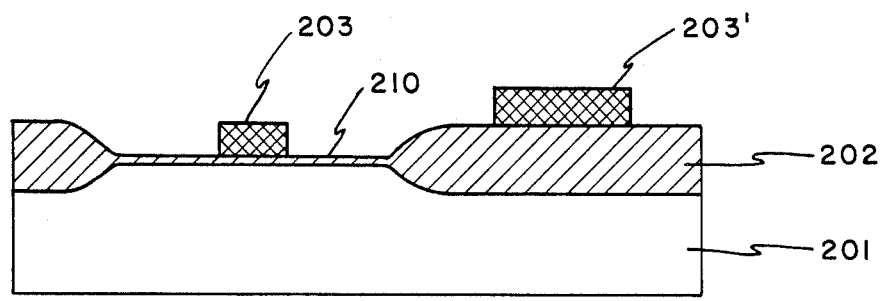
FIGS. 1A-1F are schematic sectional views of the insulated-gate field effect transistor for explaining the conventional manufacturing method thereof.
Figure 1B:
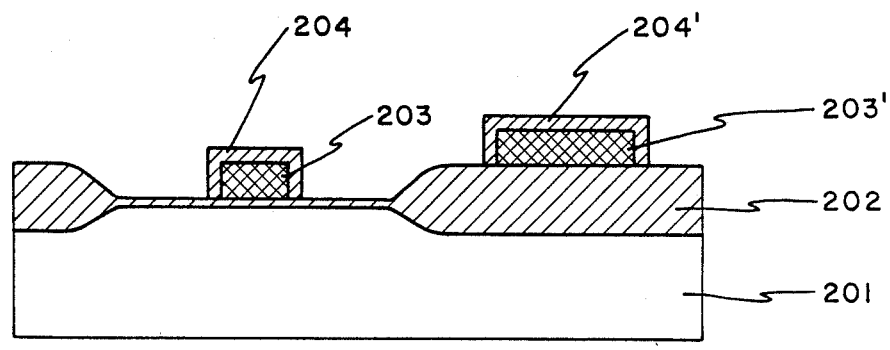
Figure 1C:
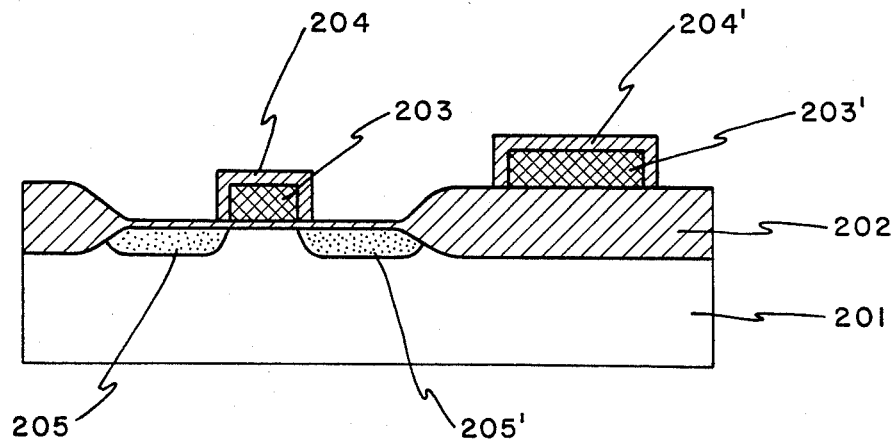
Figure 1D:
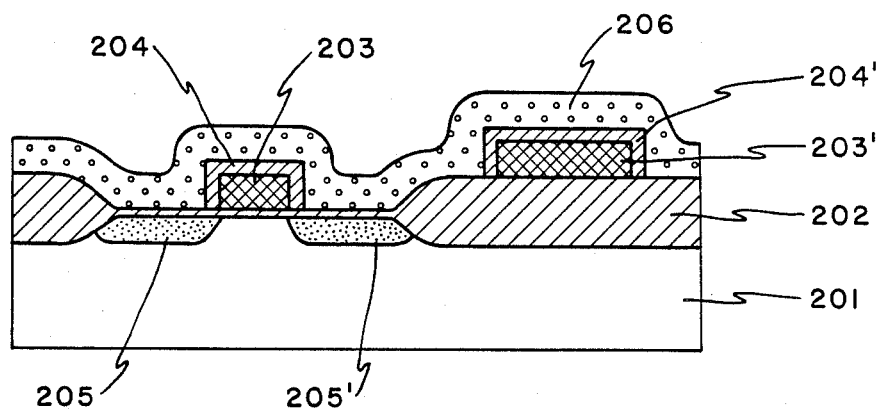
Figure 1E:
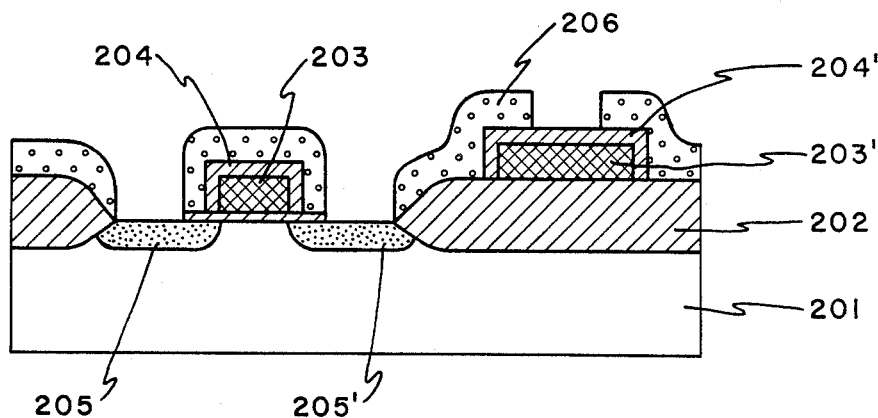
Figure 1F:
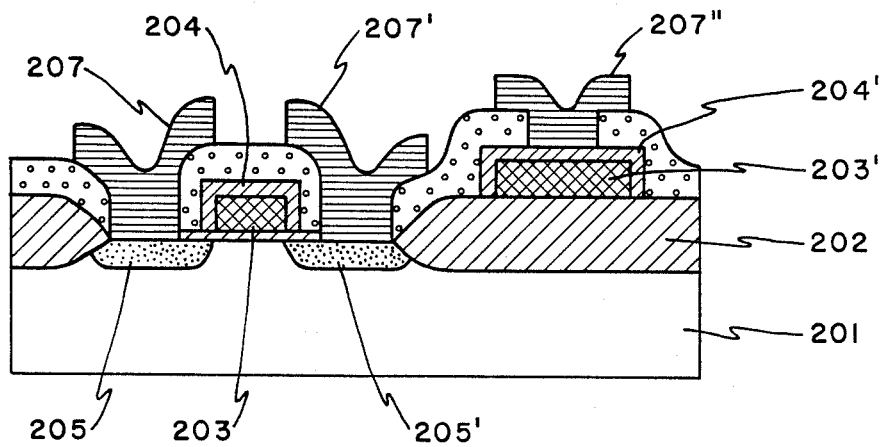
Figure 3A:
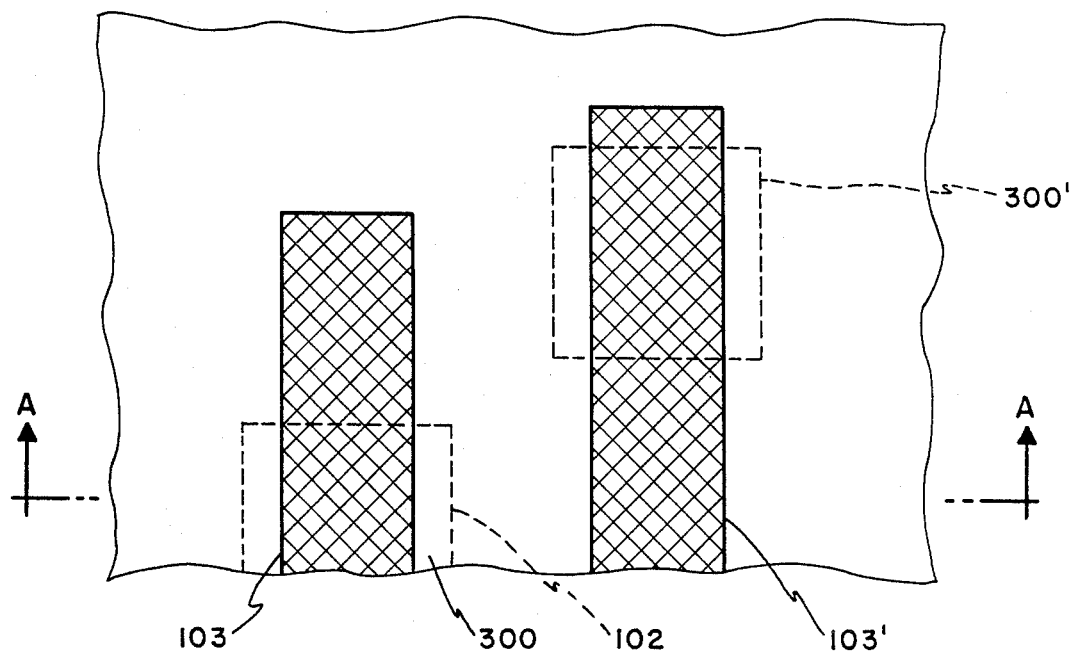
FIGS. 3A, 3C and 3F are schematic plan views corresponding to FIGS. 2A, 2C and 2F, respectively, FIG. 2A being taken along A—A line of FIG. 3A, FIG. 2C being taken along C—C line of FIG. 3C and FIG. 2F being taken along F—F line of FIG. 3F.
Figure 2A:
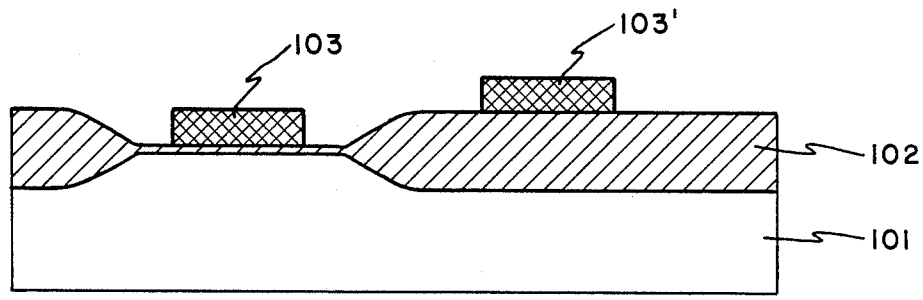
FIGS. 2A-2J are schematic sectional views of the insulated-gate field effect transistor for explaining a preferred embodiment of the manufacturing method according to the present invention.

Referring to FIGS. 2A and 3A, an oxide film 102 for isolation is formed on a P-type silicon substrate 101 at a thickness of 600 nm to define device element areas 300 and 300' isolated from one another by the oxide film 102 for isolation. Thereafter, gate oxide films having a thickness of 20 nm are formed on the respective element areas 300 and 300', and elongated polysilicon gate electrodes 103, 103' doped with phosphorus at a density of $1 \times 10^{20}$ cm$^{-3}$ are formed on the respective gate oxide films at a thickness of 300 nm by means of the photolithography technology. At this stage, the initial width of polysilicon gate electrode 103 is set greater than the final width of 1 μm of the polysilicon gate electrode 103 and 103'.

Figure 2B:
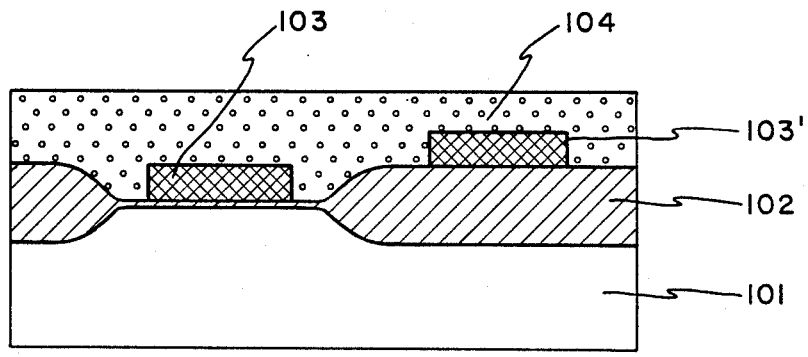

Then, a silicon oxide film is deposited at a thickness of 500 nm over the entire surface of silicon substrate 101. Thereafter the deposited silicon oxide film is coated with a polystyrene film of 1 μm by means of spin coating and these double layers are concurrently etched by means of the reactive etching to form a flat insulating interlayer of silicon oxide 104 as shown in FIG. 2B.

Figure 3C:
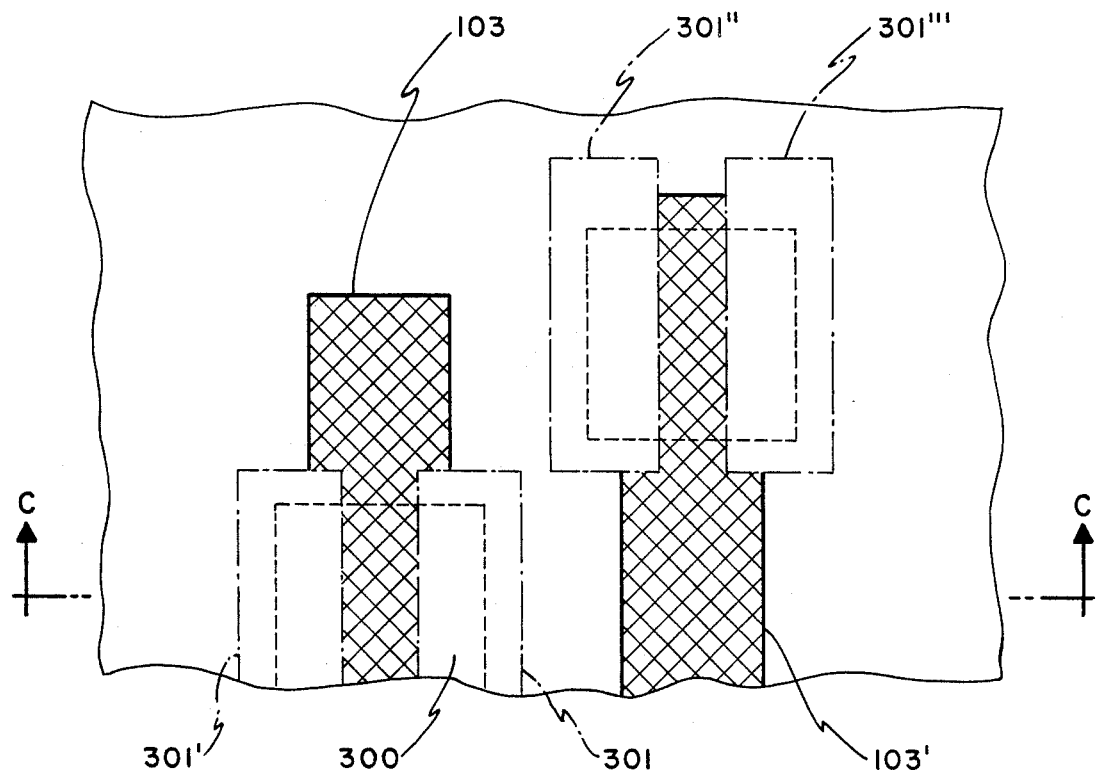
Figure 2C:
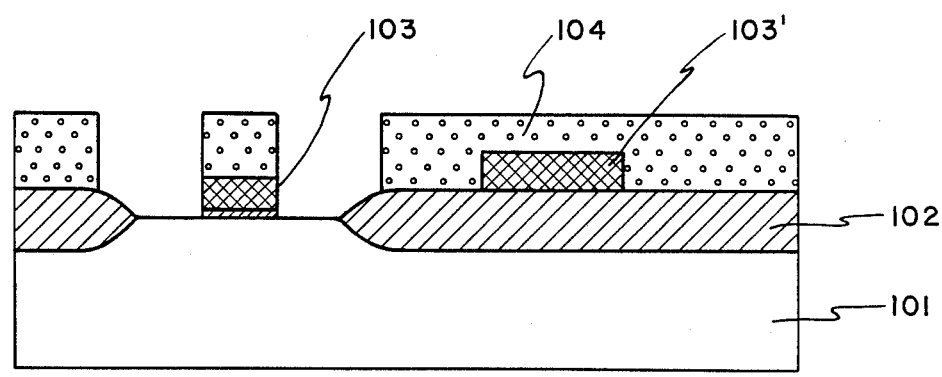

Next, as shown in FIG. 2C, and FIG. 3C, the insulating inter-layer 104 and the polysilicon gate electrode 103 and 103' are etched by means of the photolithography technology to form contact holes or openings 301, 301', 301" and 301''' through the flat insulating interlayer 104. Such contact holes 301, 301', 301" and 301''' are formed so as to make the width of the polysilicon gate electrodes 103 and 103' 1 μm, with the both sides of the gate electrodes 103 and 103' exposed by the side portion of the contact holes 301, 301', 301" and 301''' and the surface of silicon substrate 101 exposed by the bottom portion of the contact holes 301, 301', 301" and 301'''.

Figure 2D:
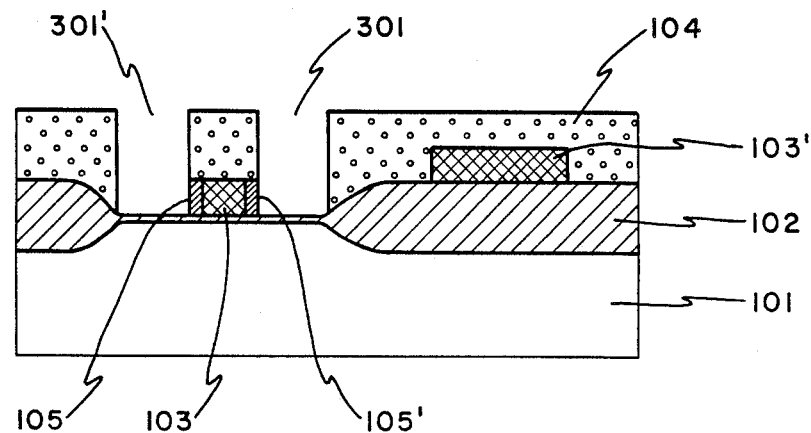

Then, referring to FIG. 2D, a pair of oxide side-films 105 and 105' are formed on the exposed sides of polysilicon gate electrode 103 at a thickness of 100 nm by means of the thermal oxidation.

Figure 2E:
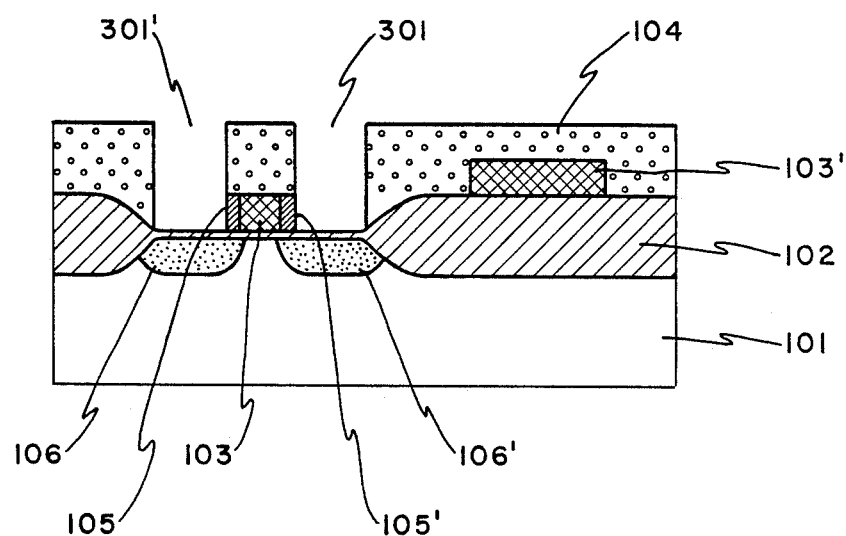

Thereafter, As of an n-type impurity is implanted through the openings 301 and 301' into the substrate 101 at the dosage of $5 \times 10^{15}$ cm$^{-2}$ with an energy of 100 KeV to form diffusion layers 106 and 106' to thereby constitute source and drain regions as shown in FIG. 2E.

Figure 3F:
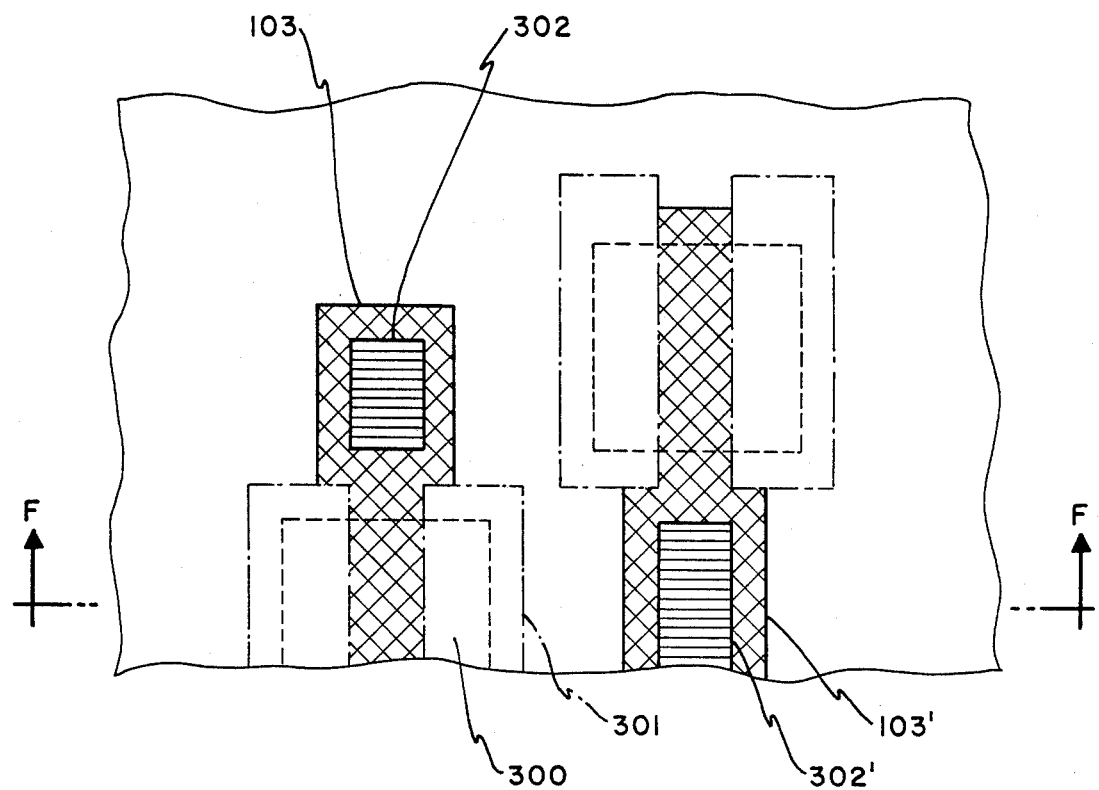
Figure 2F:
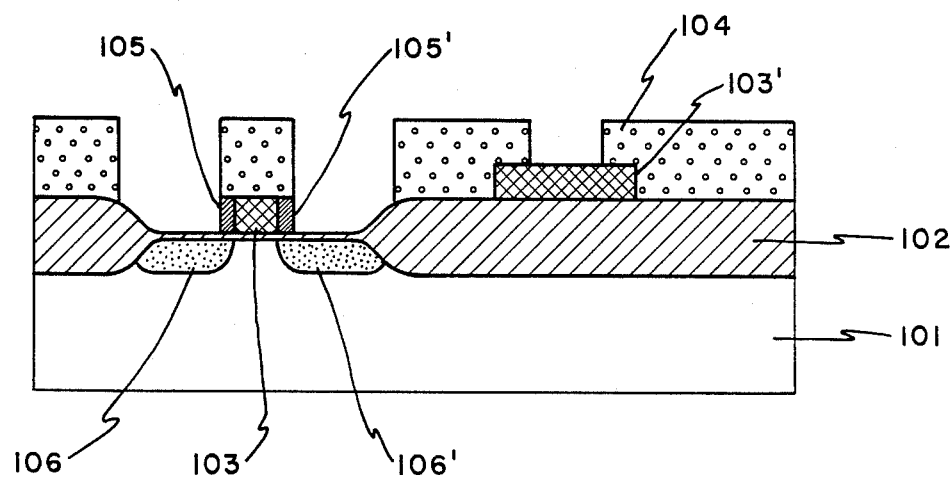

Next, as shown in FIG. 2F and FIG. 3F, the insulating inter-layer 104 is selectively etched by means of the photolithography technology to form contact holes 302 and 302' exposing the respective polysilicon gate electrodes 103 and 103' on the oxide film for isolation 102.

Figure 2G:
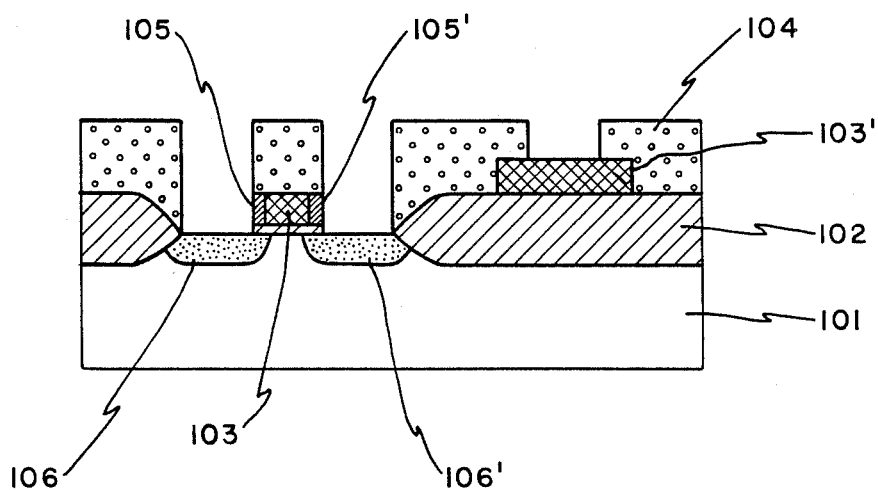
Figure 2H:
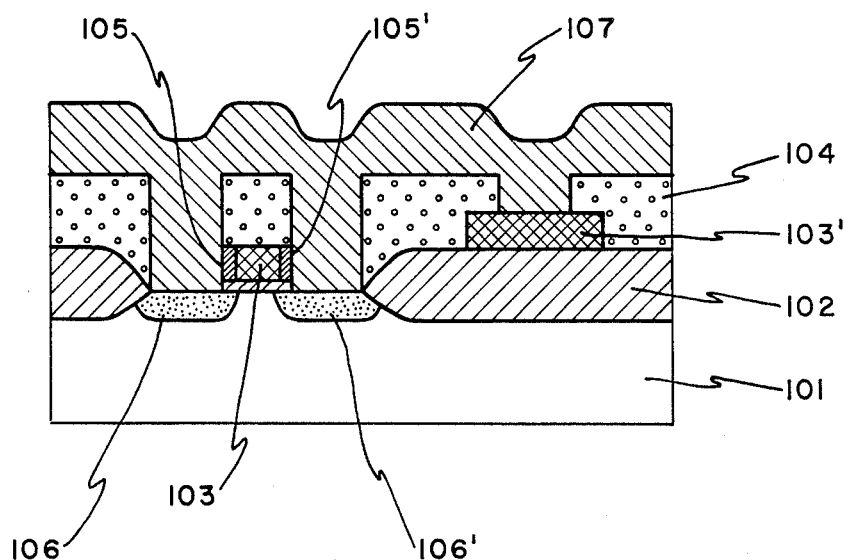
Figure 2I:
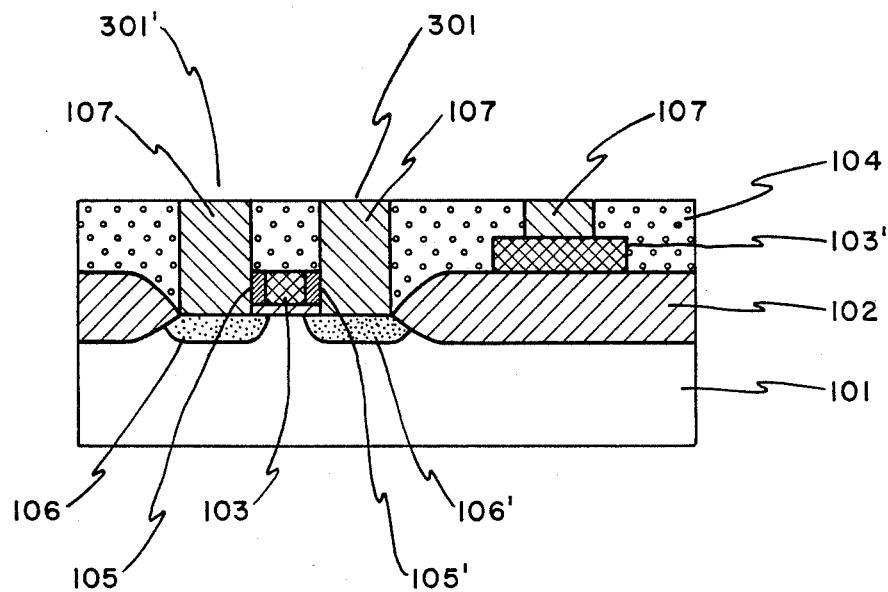

Subsequently, as shown in FIGS. 2G to 2I, the thin oxide film on the diffusion layers 106 and 106' is removed, and stuffing polysilicon 107 is deposited over the substrate at a thickness of 1 μm to fill up the contact holes 301 and 301'. Then, the surface portion of the deposited polysilicon 107 is subjected to the polishing technology utilizing aqueous solution of piperazine effective to polish silicon without polishing silicon oxide to thereby leave the polysilicon only in the contact holes 301 and 301'.

Figure 2J:
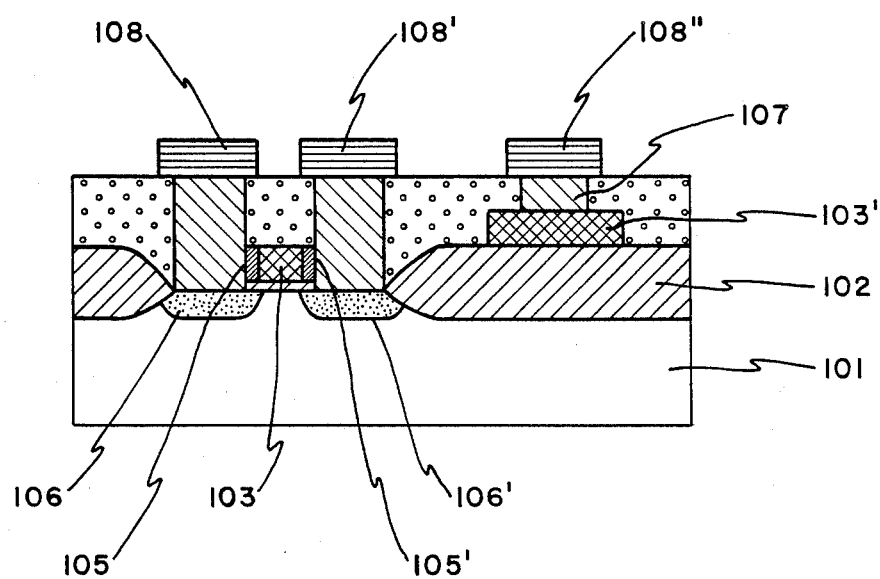

Lastly, referring to FIG. 2J, aluminum wirings 108, 108' and 108" are formed on the polished surface of the substrate to provide electrical contacts to the source and drain regions 106 and 106' and to the polysilicon gate electrodes 103'.

What is claimed is:

1. A method of manufacturing an insulated-gate field effect transistor comprising steps of:
    forming on a semiconductor substrate a gate electrode electrically insulated from said substrate;
    forming a flat insulating film over said substrate;
    forming openings through said flat insulating film at both sides of said gate electrode such that opposite sides of said gate electrode are exposed in said openings;
    forming oxide side-films on said exposed sides of said gate electrode;
    doping impurities through said openings into said substrate to form source and drain regions;
    depositing an electroconductive film over said substrate to fill the openings; and
    polishing said deposited electroconductive film to leave parts thereof selectively in said openings to thereby form electrical contacts to said source and drain regions through said openings.

2. A method of manufacturing an insulated gate field effect transistor according to claim 1 further comprising steps of forming on said substrate an insulating film for isolation to isolate device element areas each other, and forming in said device element area a gate insulating film prior to said step of forming said gate electrode on said gate insulating film.

3. A method of manufacturing an insulated-gate field effect transistor according to claim 1, wherein said step of forming said gate electrode comprises forming an elongated gate electrode having an initial width greater than the final width thereof.

4. A method of manufacturing an insulated-gate field effect transistor according to claim 3, wherein said step of forming said openings comprises a process for etching sequentially said flat insulating film and widthwise end portions of said gate electrode to determine the final width of said gate electrode.

5. A method of manufacturing an insulated-gate field effect transistor according to claim 1, wherein said step of forming an oxide side-film comprises a process for thermally oxidizing said exposed side of said gate electrode.

6. A method of manufacturing an insulated-gate field effect transistor according to claim 1, wherein said electroconductive film is a polysilicon film, said flat insulating film being silicon oxide film.

7. A method of manufacturing an insulated-gate field effect transistor according to claim 6, wherein said step of polishing said deposited polysilicon film comprises a process for selectively polishing utilizing aqueous solution effective to polish polysilicon and ineffective to polish silicon oxide.

* * * * *